United States Patent [19]

Hanamoto et al.

[11] Patent Number: 5,360,696
[45] Date of Patent: Nov. 1, 1994

[54] RESIST COMPOSITION

[75] Inventors: Yukio Hanamoto, Toyonaka; Hiroshi Takagaki, Higashiosaka; Ayako Ida, Kobe, all of Japan

[73] Assignee: Sumitomo Chemical Co., Ltd., Osaka, Japan

[21] Appl. No.: 192,817

[22] Filed: Feb. 7, 1994

Related U.S. Application Data

[62] Division of Ser. No. 996,155, Dec. 23, 1992.

[30] Foreign Application Priority Data

Dec. 27, 1991 [JP] Japan ................................. 3-346692

[51] Int. Cl.$^5$ ................................................. G03C 1/76
[52] U.S. Cl. .................................... 430/270; 430/281; 430/910
[58] Field of Search ............... 430/269, 270, 281, 910, 430/950, 961; 528/502

[56] References Cited

U.S. PATENT DOCUMENTS

| | | |
|---|---|---|
| 4,281,057 | 7/1981 | Castellani . |
| 5,240,517 | 8/1993 | Stout et al. .......................... 430/385 |
| 5,258,461 | 1/1993 | Facci et al. .......................... 430/270 |

FOREIGN PATENT DOCUMENTS

| | | |
|---|---|---|
| 211667 | 8/1986 | European Pat. Off. . |
| 0457367 | 8/1986 | European Pat. Off. . |
| 0211667 | 2/1987 | European Pat. Off. . |
| 451850 | 4/1991 | European Pat. Off. . |

OTHER PUBLICATIONS

Ultra Clean Technology, vol. 3, No. 2, pp. 83–89 (1991).
"Rejisuto Zairyou Purosesu Gijutsu" (Resist Materials. Process Technology) Gijutsu Joho Kyokai (The Japanese Soc. of Tech. Info), pp. 229–232 (1991).
"Sumitomo Kagaku" 1991-II, pp. 4–10 (1991).
IBM Technical Disclosure Bulletin, "Purification of Photoresist", vol. 11, No. 11, Apr. 69, N.Y., p. 1527.
"Photoresist Particle Control for VSLI Microlithography", M. L. Long, Solid State Technology, vol. 27, No. 3, Mar. '84, N.Y., pp. 159–160.
Photographic Abstracts, vol. 55, No. 3, 1975, London, GB, p. 83.
Japan Abstracts of Japan, vol. 7, No. 3 (C-143), Jan. 7, 1983.

*Primary Examiner*—Jack P. Brammer
*Attorney, Agent, or Firm*—Birch, Stewart, Kolasch & Birch

[57] ABSTRACT

This invention provides a process for producing a resist composition in which the content of relatively large undissolved particles is low just after production of the composition and the content of relatively large undissolved particles increases only to a small extent even if the composition is stored for a long period of time. Thus, this invention provides a process for producing a resist composition which comprises filtering a mixture of an alkali-soluble resin, a radiation-sensitive compound and a solvent by the use of a filter of which pore diameter is 0.1 μm or below and of which particle-removing performance is 99% or above. Further, this invention provides also a resist composition comprising an alkali-soluble resin, a radiation-sensitive compound and an organic solvent not simultaneously having both acetoxy group and alkoxy group in its molecule, said composition containing undissolved particles having a particle diameter of 0.25 μm or above in a number of 100 particles/ml or below, said undissolved particles being constituted of two particle groups one of which (the first group) has a particle diameter of 0.25–0.3 μm and the other of which (the second group) has a particle diameter larger than 0.3 μm, and the content of said first particle group having a particle diameter of 0.25–0.3 μm being 50 particles/ml or below.

8 Claims, No Drawings

RESIST COMPOSITION

This application is a divisional of copending application Ser. No. 07/996,155, filed on Dec. 23, 1992 now pending, the entire contents of which are hereby incorporated by reference.

BACKGROUND OF THE INVENTION

1. Field of the Invention

This invention relates to a resist composition and a process for producing a resist composition comprising an alkali-soluble resin, a radiation-sensitive compound and a solvent, said composition being sensitive to radiations such as ultraviolet ray, far ultraviolet ray, X ray, electron beam, molecular beam, γ ray, synchrotron radiation, proton beam and the like. More particularly, this invention relates to a process for producing a resist composition suitable for use in the preparation of integrated circuits, as well as to said resist composition.

2. Description of the Related Art

With the appearance of highly integrated LSI, the design geometries for integrated circuits has become finer from about 1 μm to about 0.5 μm. The resist compositions used in such fine processing are requested to have not only excellent fundamental performances such as resolution, sensitivity, profile, coating characteristics, depth of focus, etc. but also a low number of relatively large undissolved particles present in the composition in the stage just after production and a good storage stability which means that the number of such relatively large undissolved particles does not increase markedly even if the composition is stored for a long period of time. Thus, if a resist composition containing a large number of such relatively large, undissolved, visually unobservable particles is used, a substrate etched with a resist pattern given from such a resist composition often forms pin-holes in the area covered by the resist pattern and thereby the production yield of integrated circuit is decreased.

As the solvent for resist compositions, cellosolve type solvents such as ethylcellosolve acetate, etc. relatively superior in the dissolving power on radiation-sensitive compounds have generally been employed. When a cellosolve type solvent is used, however, the number of the relatively large undissolved particles in the resist composition gradually increases until it reaches an abnormally high level after a long-term storage, even though it was on a lower level just after the composition was produced. Recently, such cellosolve type solvents are being replaced by ethyl lactate or ethyl pyruvate. If these solvents are used, however, the number of relatively large undissolved particles in a resist composition just after production is greater than that given by the use of cellosolve type solvents, and the number of undissolved particles after a long-term storage is further greater than that just after production. As has been mentioned above, until now it has been impossible to produce a resist composition having low levels of relatively large undissolved particles just after production and excellent in storage stability.

SUMMARY OF THE INVENTION

According to this invention, there are provided a process for producing a resist composition having a low level of undissolved particles, both just after production of the composition and after a long-term storage of the composition, and a resist composition giving a high product yield in the production of integrated circuits.

This invention relates to a process for producing a resist composition which comprises filtering a mixture comprising an alkali-soluble resin, a radiation-sensitive compound and an organic solvent by the use of a filter of which pore diameter is 0.1 μm or below and of which particle-removing performance is 99% or above. Further, this invention relates also to a resist composition comprising an alkali-soluble resin, a radiation-sensitive compound and an organic solvent not simultaneously having both acetoxy group and alkoxy group in its molecule, said composition containing undissolved particles having a particle diameter of 0.25 μm or above in a number of 100 particles or below per milliliter, said undissolved particles being constituted of two particle groups one of which has a particle diameter of 0.25–0.3 μm and the other of which has a particle diameter greater than 0.3 μm, and the content of the first particle group having a particle diameter of 0.25–0.3 μm being 50 particles or below per milliliter.

DESCRIPTION OF THE INVENTION

As examples of the alkali-soluble resin, polyhydroxystyrene and its derivatives, styrene-maleic anhydride copolymer, polyvinyl hydroxybenzoate, carboxyl group-containing methacrylic resin, novolac resin and the like can be referred to.

As examples of the novolac resin, the resins prepared by a condensation reaction between an aldehyde and one member or a combination of two or more members selected from phenol compounds such as phenol, o-cresol, m-cresol, p-cresol, 2,5-xylenol, 3,5-xylenol, 3,4xylenol, 2,3,5-trimethylphenol, 4-t-butylphenol, 2-t-butylphenol, 3-t-butylphenol, 3-ethylphenol, 2-ethylphenol, 4-ethylphenol, 3-methyl-6-t-butylphenol, 4-methyl-2-t-butylphenol, 2-naphthol, 1,3-dihydroxynaphthalene, 1,7-dihydroxynaphthalene, 1,5-dihydroxynaphthalene and the like can be referred to.

As the aldehyde, formaldehyde, paraformaldehyde, acetaldehyde, propylaldehyde, benzaldehyde, phenylaldehyde, α-phenylpropylaldehyde, β-phenylpropylaldehyde, o-hydroxybenzaldehyde, p-hydroxybenzaldehyde, m-hydroxybenzaldehyde, glutaraldehyde, glyoxal, o-methylbenzaldehyde, p-methylbenzaldehyde and the like can be referred to. These aldehydes can be used either singly or in the form of a mixture of two or more members.

As examples of the radiation-sensitive compound, 1,2-benzoquinonediazido-4-sulfonic esters, 1,2-naphthoquinonediazido-4-sulfonic esters, 1,2-naphthoquinonediazido-5-sulfonic esters and the like can be referred to. These esters can be produced according to the well known methods. For example, they can be produced by a condensation reaction between 1,2-naphthoquinonediazido-sulfonic acid or benzoquinonediazido-sulfonic acid and a hydroxyl group-containing compound in the presence of a weak alkali. The hydroxyl group-containing compound herein referred to includes hydroquinone, resorcin, phloroglucin, 2,4-dihydroxybenzophenone; trihydroxybenzophenones such as 2,3,4-trihydroxybenzophenone, 2,2',3-trihydroxybenzophenone, 2,2',4-trihydroxybenzophenone, 2,2',5-trihydroxybenzophenone, 2,3,3'-trihydroxybenzophenone, 2,3,4'-trihydroxybenzophenone, 2,3',4-trihydroxybenzophenone, 2,3',5-trihydroxybenzophenone, 2,4,4'-trihydroyxybenzophenone, 2,4',5-trihydroxybenzophenone, 2',3,4-trihydroxybenzophenone, 3,3',4-trihydroxybenzophenone, 3,4,4'-trihydroxybenzophenone and the like; tetrahydroxybenzophenones such as 2,3,3',4-tetrahydroxybenzophenone, 2,3,4,4'-tetrahydroxybenzophenone, 2,2',4,4'-tetrahydroxybenzophenone, 2,2',3,4-tetrahydroxybenzophenone, 2,2',3,4'-tetrahydroxybenzophenone, 2,2',5,5'-tetrahydroxybenzophenone, 2,3',4',5-tetrahydroxybenzophenone, 2,3',5,5'-tetrahydroxybenzophenone and the like; pentahydroxybenzophenones such as 2,2',3,4,4'-pentahydroxybenzophenone, 2,2',3,4,5'-pentahydroxybenzophenone, 2,2',3,3',4-pentahydroxybenzophenone, 2,3,3',4,5'-pentahydroxybenzophenone and the like; hexahydroxybenzophenones such as 2,3,3',4,4',5'-hexahydroxybenzophenone, 2,2',3,3',4,5'-hexahydroxybenzophenone and the like; and alkyl gallates, the oxyflavans mentioned in Japanese Patent Application KOKAI No. 2-84650 (corresponding to U.S. Pat. No. 5,059,507) as general formula (I), the phenol compounds mentioned in Japanese Patent Application KOKAI No. 2-269351 (corresponding to European Patent Publication No. 341 608A) as general formula (I), and the phenol compounds represented by the following general formula (II):

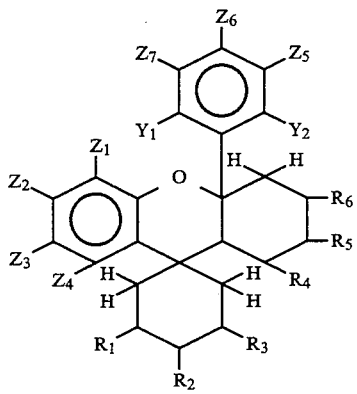

wherein $Y_1$, $Y_2$, $Z_1$, $Z_2$, $Z_3$, $Z_4$, $Z_5$, $Z_6$ and $Z_7$ independently of one another each represent a hydrogen atom, a hydroxyl group or an alkyl group, provided that at least one of $Y_1$ and $Y_2$ is a hydroxyl group and at least two of $Z_1$, $Z_2$, $Z_3$, $Z_4$, $Z_5$, $Z_6$ and $Z_7$ are hydroxyl groups, and $R_1$, $R_2$, $R_3$, $R_4$, $R_5$ and $R_6$ each represent a hydrogen atom, an alkyl group having 1-10 carbon atoms, an alkenyl group having 2-4 carbon atoms, a cycloalkyl group or an aryl group.

As preferable members of said hydroxy group-containing compound, the oxyflavans mentioned in Japanese Patent Application KOKAI No. 2-84650 as general formula (I) and the phenol compounds represented by the above-mentioned general formula (II) can be referred to.

The above-mentioned radiation-sensitive compounds are used either singly or in the form of a mixture of two or more members.

The ratio between the alkali-soluble resin and the radiation-sensitive compound is usually 5-100 parts by weight, preferably 10-50 parts by weight of radiation-sensitive compound per 100 parts by weight alkali-soluble resin, because patterning is easy to practice and sensitivity is good at such a ratio.

As examples of the organic solvent not simultaneously having both acetoxy group and alkoxy groups in its molecule and having a boiling point of 140° C. to 180° C., acetic esters such as butyl acetate, amyl acetate and the like, straight chain, branched chain or cyclic ketones having 10 or fewer carbon atoms such as 2-heptanone, cyclohexanone and the like, $C_1$–$C_4$ alkyl monooxy-carboxylates such as methyl lactate, ethyl lactate and the like, $C_1$–$C_4$ alkyl monoalkoxy-carboxylates such as methyl 2-methoxypropionate, ethyl 2-methoxypropionate and the like, and $C_1$–$C_4$ alkyl pyruvates such as ethyl pyruvate and the like can be referred to.

The quantity of the solvent is not critical, so far as a coating film uniform in quality and having no pin-holes nor unevenness can be formed on a wafer. Usually, however, the quantity is regulated so that the concentration of solid ingredients including radiation-sensitive compound and alkali-soluble resin in the composition comes to 3–50% by weight based on the composition.

If desired, small quantities of resin, dye and the like can be incorporated into the resist composition.

The resist composition of this invention can be produced according to various methods. For example, it can be produced by filtering a mixture comprising a radiation-sensitive compound, an alkali-soluble resin and the like and a solvent by the use of a filter having a pore diameter of about 0.1 μm. The filtration is carried out at ordinary temperature (usually 20°–25° C.).

As examples of the elementary material used for constituting the filter membrane, fluoro resins such as polytetrafluoroethylene (PTFE) and the like, polyolefin resins such as polypropylene, polyethylene and the like, and polyamide resins such as nylon 6, nylon 66 and the like can be referred to. The filter preferably has a pore diameter of 0.1 μm or less and a particle-removing performance of 99% or above. As used herein, the term "particle-removing performance" means an ability to remove a polystyrene uniform latex particle having a particle diameter of 0.1 μm. The ability to remove a latex particle is represented by, for example, the removal rate which a filter exhibits when fed with a latex such as Dowuniform (manufactured by Dow Chemical Co.) or the like dispersed in ultrapure water. A removal rate can be determined by measuring the number of particles by means of a particle counter or the like before and after feeding a particulate material to a filter.

As a more desirable process for producing a resist composition, a process which comprises using an organic solvent composed mainly of one or more members selected from straight chain ketones having 10 or fewer carbon atoms such as 2-heptanone and the like, $C_1$–$C_4$ alkyl monooxy-carboxylates such as methyl lactate, ethyl lactate and the like, $C_1$–$C_4$ alkyl monoalkoxy-carboxylates such as methyl 2-methoxypropionate, ethyl 2-methoxypropionate and the like and $C_1$–$C_4$ alkyl pyruvates such as ethyl pyruvate and the like and using a filter of which pore diameter is 0.1 μm or below and of which particle-removing performance is 99% or above can be referred to.

According to the process of this invention, there can be obtained a resist composition in which the number of relatively large undissolved particles is at a low level just after production of the composition and the number of relatively large undissolved particles increases only to a small extent even if the composition is stored for a long period of time. Further, if the resist composition of this invention is used, pin-holes are scarcely formed in the resist pattern-covered area of substrate, owing to which the product yield in the production of integrated circuits can be improved.

PREFERRED EMBODIMENTS OF THE INVENTION

Next, this invention will be explained more concretely with reference to the following examples. This invention is by no means limited by the examples.

EXAMPLE 1

Into a vessel were charged 4.0 kg of a m/p-cresol novolac resin prepared at molar ratios of m/p=50/50 and cresol/formaldehyde=1/0.75 and having a weight average molecular weight of 8,000 and 0.86 kg of a 1,2-naphthoquinonediazido-sulfonate of a phenol compound represented by the following formula:

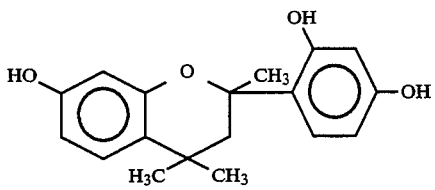

(ratio of reactants 1:2.7 by mole) together with 12.5 kg of 2-heptanone and 0.66 kg of γ-butyrolactone in the dark. After dissolving the raw materials by stirring them, the resulting solution was filtered by the use of a 10 inch cartridge filter (CLEARSEP TM manufactured by Mitsubishi Chemical Industries, Ltd.) having a pore diameter of 0.09 μm and a particle-removing performance (measured on polystyrene uniform latex particles having a particle diameter of 0.091 μm) of 99% or above [the cartridge filter is mentioned in "Ultraclean Technology" Vol. 3, 2, 83(203)-89(209), (1991)] and thereafter filled into a clean gallon bottle to prepare a positive type resist composition.

The number of fine particles in the composition just after its production was measured by means of Automatic Fine Particle Measurement Device (Model KL-20) manufactured by Lion Co., Ltd. The results were as follows:

the number of particles larger than 0.25 μm: 23/ml,
the number of particles of 0.25-0.3 μm: 8/ml.

Then, the composition was left standing in a clean room at 22°-24° C. for 45 days and thereafter the number of fine particles was measured to obtain the following good results:

the number of particles larger than 0.25 μm: 45/ml,
the number of particles of 0.25-0.3 μm: 25/ml.

When an integrated circuit was prepared from the resist composition, the yield of the production was good.

COMPARATIVE EXAMPLE 1

A positive type resist composition was prepared in the same manner as in Example 1, except that the filter used in Example 1 was replaced with a filter (EMFLON manufactured by Japan Pall Co., Ltd.) having a pore diameter of 0.1 μm and a particle-removing performance (measured on a polystyrene uniform latex having a particle diameter of 0.109 μm) of 20%. Then, the number of fine particles in the composition just after its production was measured. The results were as follows:

the number of particles larger than 0.25 μm: 169/ml,
the number of particles of 0.25-0.3 μm: 123/ml.

When the composition was stored in a clean room at 22°-24° C. for 45 days, the number of fine particles further increased.

What is claimed is:

1. A resist composition comprising an alkali-soluble resin, a radiation-sensitive compound and a solvent not simultaneously having both acetoxy group and alkoxy group in its molecule, the composition containing undissolved particles having a particle diameter of 0.25 μm or above in a number of 100 particles/ml or below, the undissolved particles being constituted of two particle groups one of which (the first group) has a particle diameter of 0.25-0.3 μm and the other of which (the second group) has a particle diameter larger than 0.3 μm, and the content of the first group having a particle diameter of 0.25-0.3 μm being 50 particles/ml or less.

2. A resist composition according to claim 1, wherein the solvent not simultaneously having both acetoxy group and alkoxy group in its molecule comprises a solvent having a boiling point of 140°-180° C. as a main component.

3. A resist composition according to claim 2, wherein the solvent having a boiling point of 140°-180° C. is at least one solvent selected from the group consisting of straight chain ketones having 10 or less carbon atoms, $C_1$-$C_4$ alkyl monooxy-carboxylates, $C_1$-$C_4$ alkyl monoalkoxy-carboxylates and $C_1$-$C_4$ alkyl pyruvates.

4. The resist composition according to claim 1, wherein said alkali-soluble resin is selected from the group consisting of polyhydroxystyrenes, styrene-maleic anhydride copolymers, polyvinyl hydroxybenzoate, carboxyl-group containing methacrylic resins and novolac resins.

5. The resist composition according to claim 4, wherein said alkali-soluble resin is a novolac resin.

6. The resist composition according to claim 1, wherein said radiation-sensitive compound is at least one selected from the group consisting of 1,2-benzoquinonediazido-4-sulfonic esters, 1,2-naphthoquinonediazido-4-sulfonic esters and 1,2-naphthoquinonediazido-5-sulfonic esters.

7. The resist composition according to claim 1, wherein the ratio of said alkali-soluble resin to said radiation-sensitive compound is from 5-100 parts by weight of said radiation-sensitive compound per 100 parts by weight of said alkali-soluble resin.

8. The resist composition according to claim 5, wherein the concentration of solid ingredients, including said alkali-soluble resin and said radiation-sensitive compound, is from 3-50% by weight.

* * * * *